(12) United States Patent
Mo et al.

(10) Patent No.: US 8,858,257 B2
(45) Date of Patent: Oct. 14, 2014

(54) CARD EDGE CONNECTOR HAVING EJECTOR WITH HIDDEN LUMP PORTION

(71) Applicants: Chi-Tung Mo, New Taipei (TW); Xiao-Zhi Fu, Kunshan (CN); Ze-Lin Yao, Kunshan (CN); Xue-Wu Bu, Kunshan (CN); Ming-Chang Tsai, New Taipei (TW); Jui-Chi Su, New Taipei (TW)

(72) Inventors: Chi-Tung Mo, New Taipei (TW); Xiao-Zhi Fu, Kunshan (CN); Ze-Lin Yao, Kunshan (CN); Xue-Wu Bu, Kunshan (CN); Ming-Chang Tsai, New Taipei (TW); Jui-Chi Su, New Taipei (TW)

(73) Assignee: Hon Hai Precision Industry Co., Ltd., New Taipei (TW)

( * ) Notice: Subject to any disclaimer, the term of this patent is extended or adjusted under 35 U.S.C. 154(b) by 30 days.

(21) Appl. No.: 13/684,182

(22) Filed: Nov. 22, 2012

(65) Prior Publication Data
US 2013/0130526 A1    May 23, 2013

(30) Foreign Application Priority Data
Nov. 22, 2011 (CN) .......................... 2011 2 0465619

(51) Int. Cl.
H01R 9/05 (2006.01)
H01R 12/72 (2011.01)
H01R 13/629 (2006.01)
H05K 7/14 (2006.01)

(52) U.S. Cl.
CPC ........ H01R 13/62977 (2013.01); H01R 12/721 (2013.01); H05K 7/1431 (2013.01)

USPC ........................................................... 439/578

(58) Field of Classification Search
CPC ........................... H01R 13/635; H01R 13/518
See application file for complete search history.

(56) References Cited

U.S. PATENT DOCUMENTS

| 6,599,142 | B2 * | 7/2003 | Bu ................................ 439/157 |
| 8,157,576 | B2 * | 4/2012 | Fu et al. .......................... 439/153 |
| 8,444,424 | B2 * | 5/2013 | Shen et al. ...................... 439/153 |
| 8,506,312 | B2 * | 8/2013 | Li et al. .......................... 439/159 |
| 2003/0073332 | A1 * | 4/2003 | Bu ................................ 439/159 |
| 2011/0076868 | A1 * | 3/2011 | Yao et al. ........................ 439/153 |
| 2011/0097913 | A1 * | 4/2011 | Fu et al. .......................... 439/153 |

FOREIGN PATENT DOCUMENTS

CN    2665786    12/2004

* cited by examiner

*Primary Examiner* — Chandrika Prasad
(74) *Attorney, Agent, or Firm* — Wei Te Chung; Ming Chieh Chang

(57) ABSTRACT

A card edge connector (100) includes an elongated insulative housing (1), a plurality of contacts (2) and an ejector (3) assembled in the insulative housing (1). The ejector (3) has a base (31) and two gripping portions (34) extending upwardly from the base (31). The gripping portions have an accommodating slot (340) therebetween for receiving a bottom edge of a memory module (200). The accommodating slot (340) has a first accommodating slot (3401) and a second accommodating slot (3402) for receiving a vertical bottom edge (211) and a transverse bottom edge (212) of the memory module (200), respectively. Thereby the memory module (200) could be stably inserted in the card edge connector (100).

18 Claims, 6 Drawing Sheets

CARD EDGE CONNECTOR HAVING EJECTOR WITH HIDDEN LUMP PORTION

BACKGROUND OF THE INVENTION

1. Field of the Invention

The present invention generally relates to a card edge connector and more particularly to a card edge connector with an ejector assembled therein.

2. Description of Related Art

Chinese patent application publication No. 2665786, published on Dec. 22, 2004, discloses a card edge connector including an insulative housing, a plurality of contacts retained in the insulative housing and an ejector assembled in one side of the insulative housing. The insulative housing includes two opposite side walls, a central slot and two end walls located between the two side walls. The side walls include two attaching portions extending from the side walls. The attaching portion has a base, a pair of gripping portions extending upwardly from the base and an ejector portion extending forwardly from a bottom of the base. A accommodating slot is formed between two gripping portions. The gripping portion has a plating portion and a handing portion extending transverse and aslant from the planting portion. The ejector also has a lump portion connecting two plating portions and located in a left of the accommodating slot. The memory module is received in the accommodating slot and the lump portion resists a notch of the memory module downwardly to prevent the memory module from moving upwardly. But only a bottom edge of the memory module received in the accommodating of the ejector, it is easy to actuate the memory module by an outside force that may make the memory module shake.

Other objects, advantages and novel features of the present invention will become more apparent from the following detailed description of the present embodiment when taken in conjunction with the accompanying drawings.

SUMMARY OF THE INVENTION

The present invention provides a card edge connector comprises an elongated insulative housing extending along a left-to-right direction, a plurality of contacts retained in the insulative housing and an ejector. The insulative housing has a pair of opposite two side walls, a central slot formed between two side walls, two end walls located in two sides of the central slot and an attaching portion extending out from the end wall. The ejector is assembled to the attaching portion and has a base and two gripping portions extending upwardly from two side of the base, two gripping portions have a accommodating slot located therebetween and a lump portion located in the accommodating slot and connecting two gripping portions, a memory module is received in the accommodating slot and the lump portion locking the memory module, the accommodating slot has a first accommodating slot and a second accommodating slot communicated with the second accommodating slot.

Other objects, advantages and novel features of the present invention will become more apparent from the following detailed description of the present embodiment when taken in conjunction with the accompanying drawings.

DETAILED DESCRIPTION OF THE INVENTION

Figure 1:
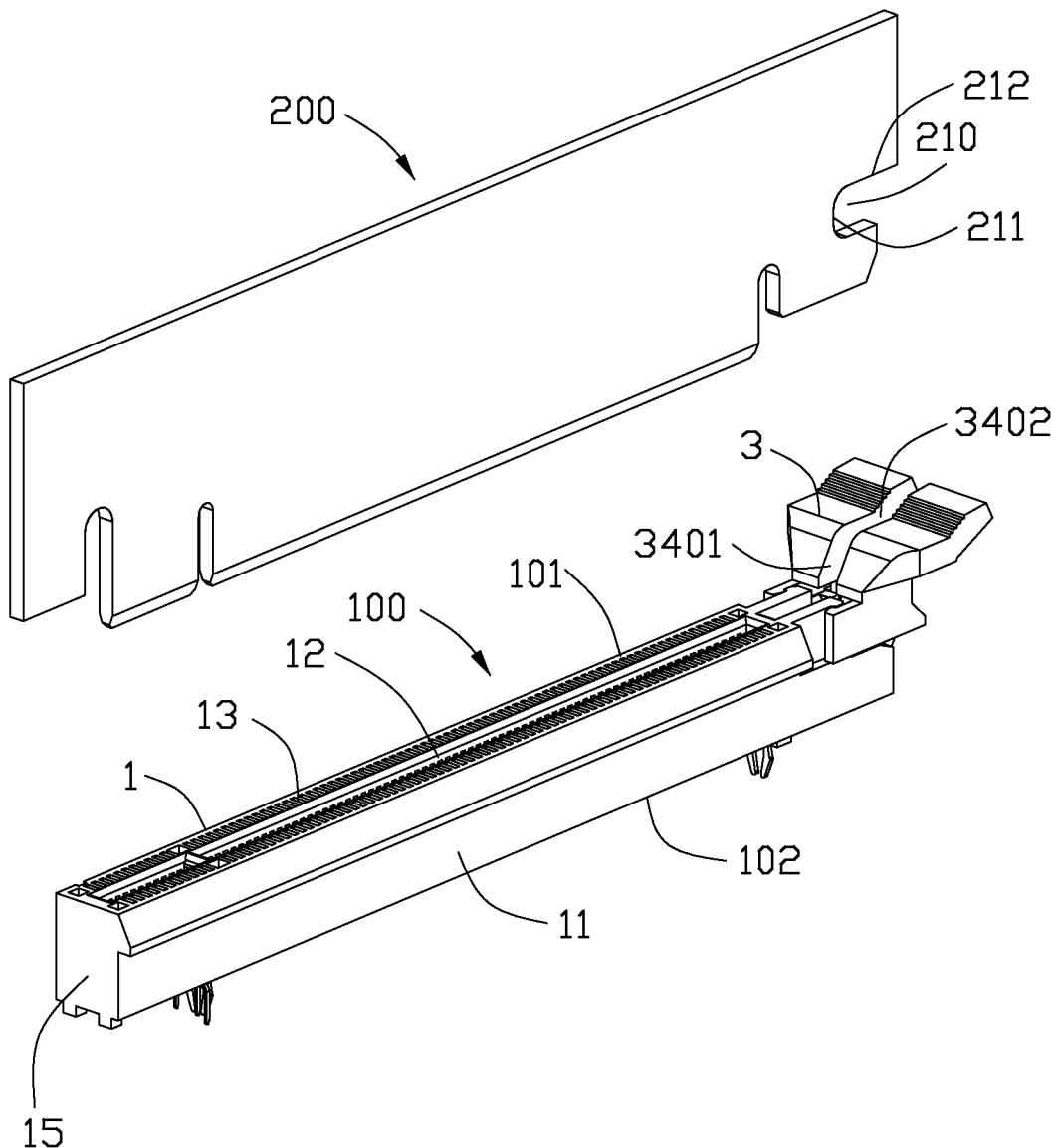
FIG. 1 is an assembled perspective view of a card edge connector with a memory module according to a preferred embodiment of the present invention.

Reference will now be made to the drawing figures to describe the preferred embodiment of the present invention in detail.

Figure 2:
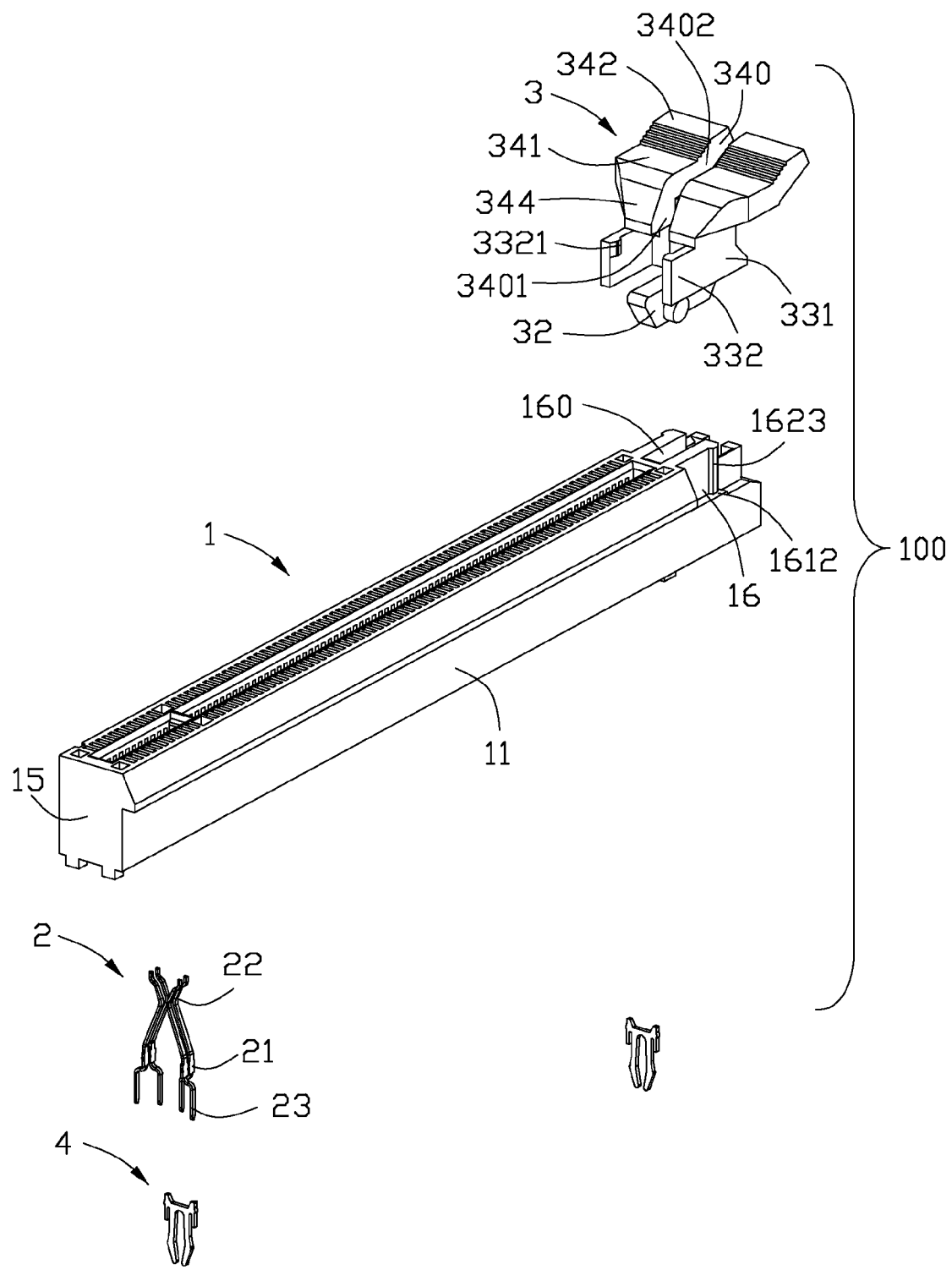
FIG. 2 is an exploded, perspective view of the card edge connector as shown in FIG. 1.

Referring to FIGS. 1-2, a card edge connector 100 according to the present invention is preferably a memory socket to be mounted on a mother printed circuit board, comprises an elongated insulative housing 1, a plurality of contacts 2 retained in the housing 1, an ejectors 3 pivoted on one end of the housing 1 and latching with a notch 210 of a memory module 200 and a pair of board locks 4 mounted onto a bottom side of the housing 1.

Figure 3:
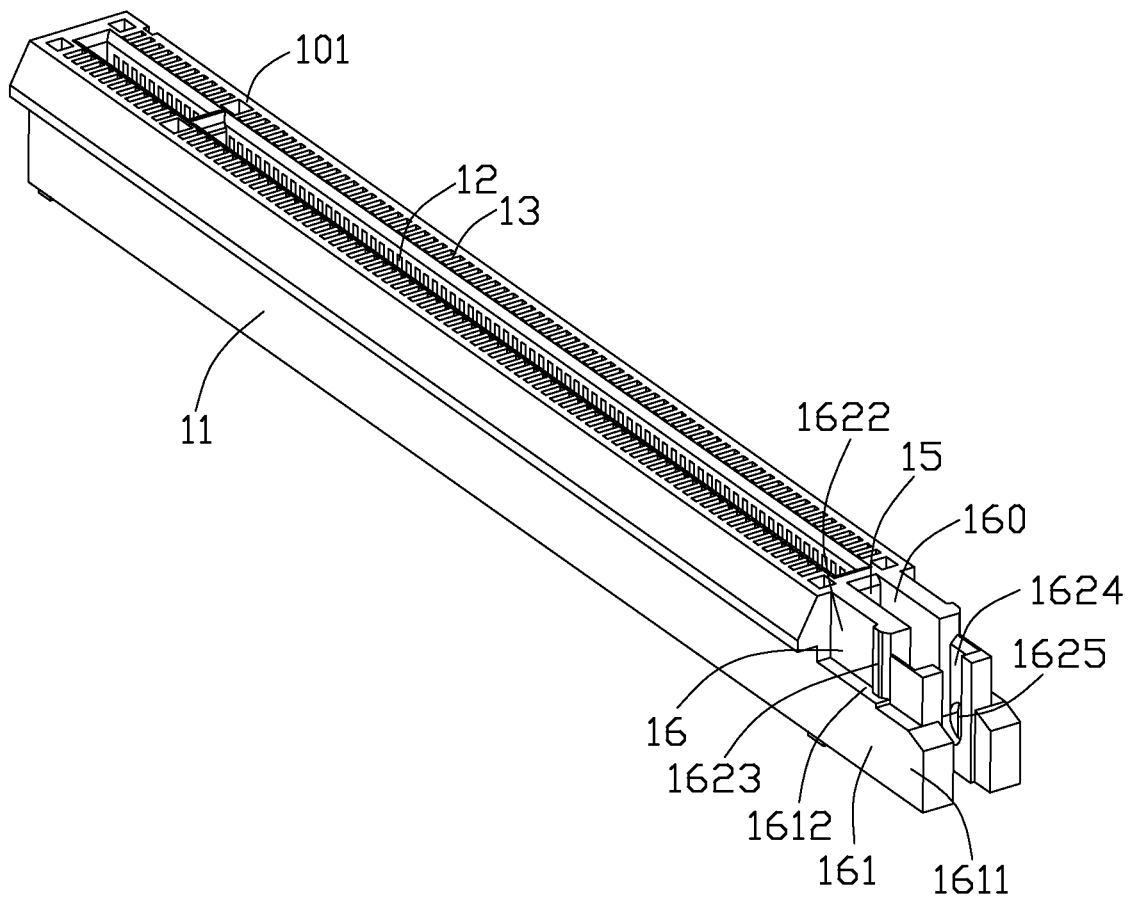
FIG. 3 is a perspective view of an insulative housing of the card edge connector as shown in FIG. 1.

Referring to FIGS. 1-3, the insulative housing 1 includes a pair of opposite side walls 11, an elongated central slot 12 formed between two side walls 11, a plurality of terminal slots 13 depressing from two side walls 11 and communicating with the central slot 12 and two end walls 15 located in the two sides of the central slot 12 and a key (not labeled) formed in the central slot 12 to divide the central slot 12 into a left portion and a right portion to prevent the memory module 200 from wrongly inserting. The length direction of the insulative housing 1 is defined as a left-to-right direction and a direction which is vertical with the two side walls 11 is defined as a front-to-rear direction. The insulative housing 1 includes an inserting face 101 mating with the memory module 200 and a mounting face 102 mounting on a mother printed circuit board.

The insulative housing 10 includes an attaching portion or tower 16 extending outside from end wall 15. The attaching portion 16 includes a pair of extending walls 161 located along the front to rear direction and an attaching space 160 formed between two extending walls 161. In the left-to-right direction, the end wall 15 is located between the central slot 12 and the attaching space 160. The extending wall 161 is disposed as a step-shape and has a first side wall 1611 coplanar with an outer face of the side wall 11, a second side wall 1622 extending upwardly from an inner part of the first side wall 1611 and having a thinner thickness along the front-to-rear direction. A top face without the second side wall 1622 defines a horizontal attaching face 1612. The second side wall 1622 has a vertical protrusion rib 1623 extending outwardly from a middle thereof and not extending beyond the outer face of the first side wall 1611. The second side wall 1622 has a retaining slot 1624 located in an inner face thereof and communicated with the attaching space 160. The retaining slot 1624 passes through the second side wall 1622 upwardly and extends downwardly to the first side wall 1611 but does not pass through the first side wall 1611. Each retaining slot 1624 has a pivot hole 1625 located in a bottom thereof.

Referring to FIG. 2, the contacts 2 are mounted in the terminal slots 13. Each of the contacts 2 includes a retaining portion 21 retained in the terminal slot 13, a contacting portion 22 extending into the central slot 12 upwardly from one end of the retaining portion 21 for contacting with the memory module 200 and a soldering portion 23 extending downwardly from another end of the retaining portion 21 for soldering to the mother printed circuit board.

Figure 4:
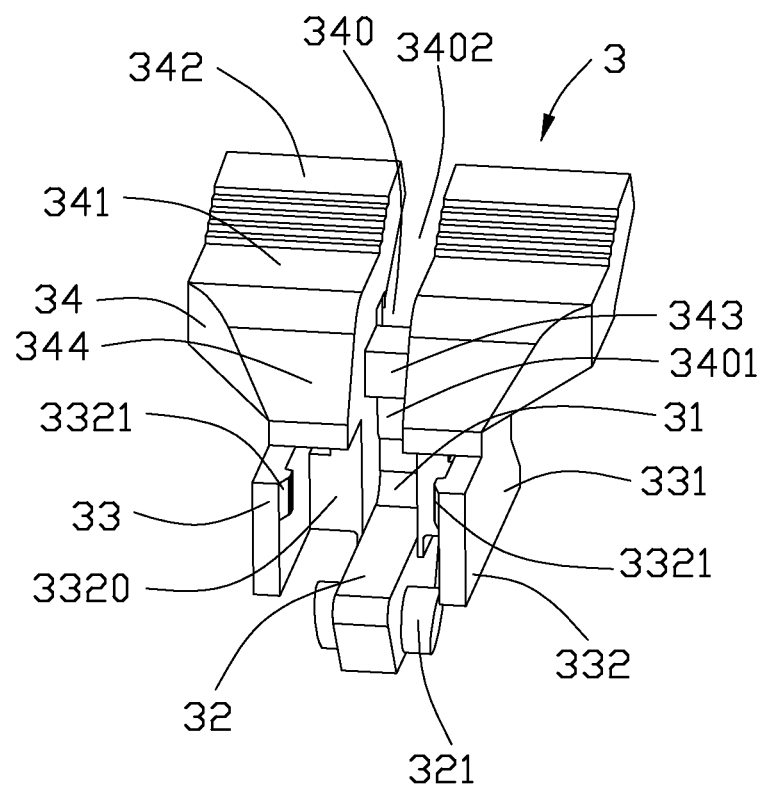
FIG. 4 is a perspective view of an ejector of the card edge connector as shown in FIG. 1.

Referring to FIGS. 2-4, the ejector 3 is retained in the attaching portion 16, and has a base 31, an ejecting portion 32 inwardly extending to the central slot 12 from a lower end of the base 31, two locking portions 33 located in two side of the base 31 and two gripping portions 34 extending upwardly and aslant from the base 31. An accommodating slot 340 is formed between the two gripping portion 34 and passes through the ejector 3 along a left-to-right direction. The memory module 200 is received in the accommodating slot 340 partly and clamped by the two gripping portion 34 to prevent the memory module 200 moving along the front to rear direction. The ejector portion 32 has a pair of shafts 321 located at two outer lateral sides thereof and received into the pivot holes 1625 of the insulative housing 1.

The locking portion 33 includes a connecting portion 331 connecting with the base 31 and a positioning wall 332 extending into toward the central slot 12 from a middle of the connecting portion 331. A receiving space 3320 is formed between two positioning walls 332. The positioning wall 332 has a protruding portion 3321 located in a front thereof and extending inwardly thereof. The second side wall 1622 is received in the receiving space 3320 and the protruding portion 3321 latches with the protrusion rib 1623 along the left to right direction to prevent the ejector 3 from rotating up and down.

The gripping portion each 34 includes a horizontal plating portion 341, a handing portion 342 extending toward a right direction from the plating portion 341 and a extending portion 344 extending toward a left direction from the plating portion 341. The accommodating slot 340 includes a first accommodating slot 3401 located between two extending portions 344 and a second accommodating slot 3402 located between two handing portions 342. The seconding accommodating slot 3402 includes a lump portion 343 connecting two handing portions 342. The lump portion 343 is located in the right direction of the first accommodating slot 3401 and is far away from the central slot 12 rather than the first accommodating slot 3401. A top of the first accommodating slot 3401 is communicated with a top of the second accommodating slot 3402, and the lump portion 343 is protectively downwardly hidden under the accommodating slot 340. Notably, the shaft 321 is essentially located at an inner position along the longitudinal direction, compared with the lump portion 343 which is located an outer position along the longitudinal direction.

When the memory module 200 is inserted into the central slot 12, the lump portion 343 is received in the notch 210 of the memory module 200 and resisting the memory module 200 downwardly to lock the memory module 200. The memory module 200 has a vertical bottom edge 211 located in a left of the notch 210 and a transverse top edge 212 located in a top of the notch 210. The vertical bottom edge 211 is received in the first accommodating slot 3401 and the transverse top edge 212 is received in the second accommodating slot 3402, so that the memory module 200 is retained in the card edge connector 100 with a side edge portion partially received within the accommodating slot 340 and is prevented from shaking along the front to back direction.

Figure 5:
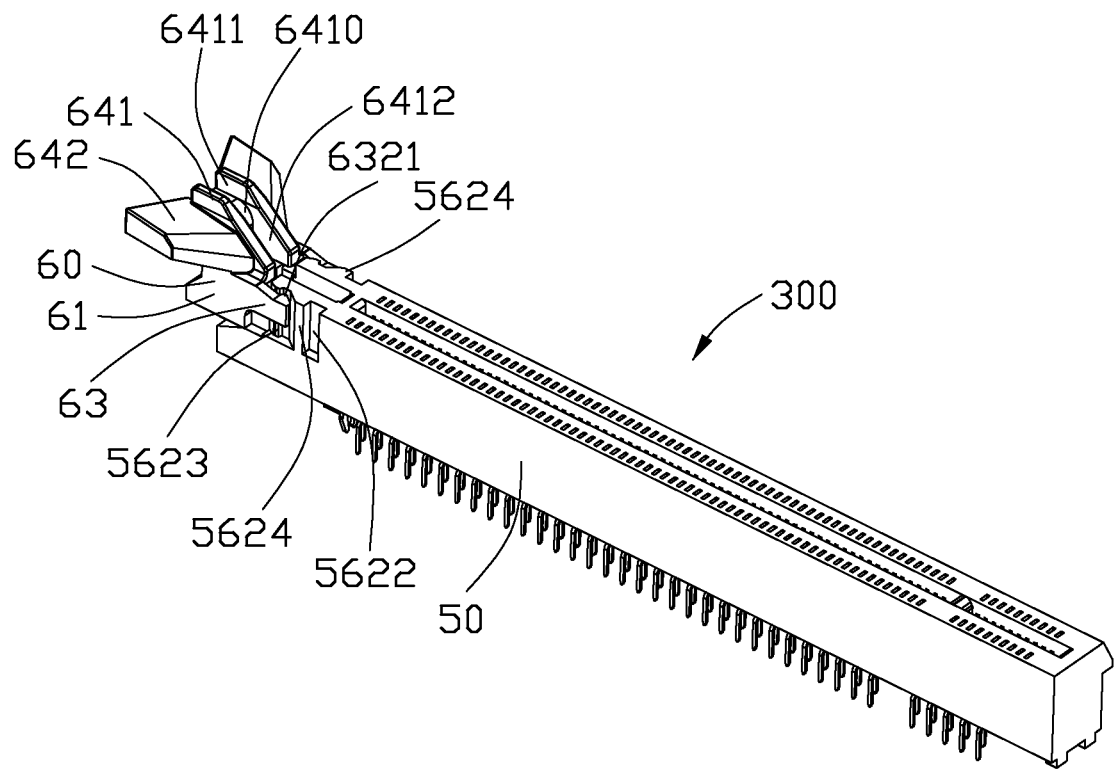
FIG. 5 is a perspective view of a card edge connector according to a second embodiment of the present invention
Figure 6:
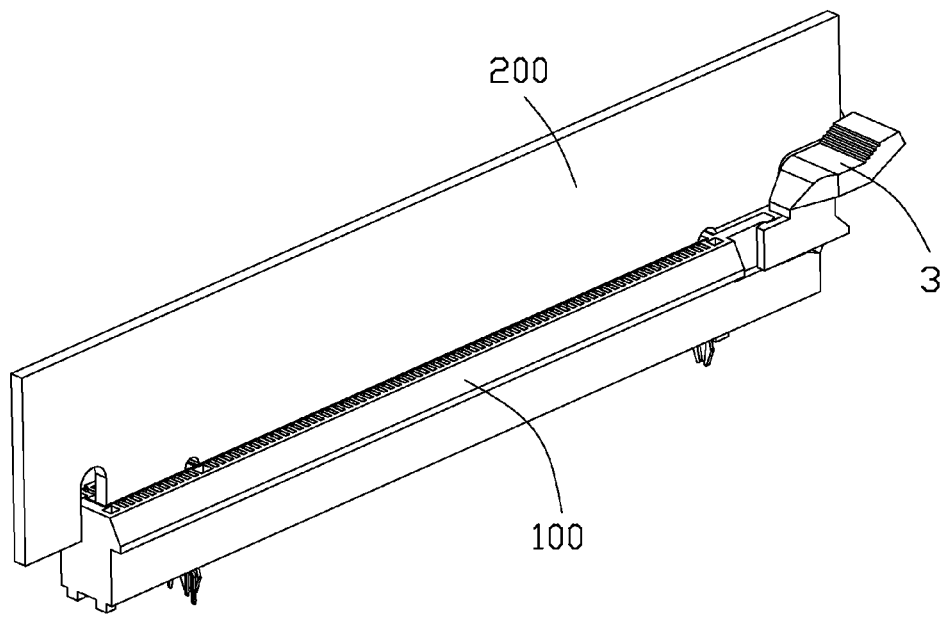
FIG. 6 is an assembled perspective view of the card edge connector of FIG. 1 with the memory module 200 therein.

Referring to FIG. 5, an card edge connector 300 in accordance with a second embodiment of present invention is disclosed. An insulative housing 50 of the card edge connector 300 is approximately similar to the insulative housing 10 of the electrical card connector 100 in the first embodiment, and the only difference is that: the second side wall 5622 of the insulative housing 50 further has a vertical convex 5624 located in a right of the protrusion rib 5623. The convex 5624 protect a face end of a locking portion 63 of the ejector 60. A protruding portion 6321 of the locking portion 63 is locked with the protrusion rib 5623 along the left to right direction. The protruding portion 6321 is located between the protrusion rib 5623 and the convex 5624. A side of the convex 5624 which is faces to the protruding portion 6321 has an aslant face. Since the convex 5624 blocks the locking portion 63 from a right side, the ejector 60 will not be actuated by any unexpected outside force front the right direction. A handing portion 642 of the ejector 60 in the second embodiment is different from the first embodiment. The handing portion 642 is disposed as an airfoil of a plane and has two ribs 641 extending upwardly from an inner part of the handing portion 642. An accommodating slot is formed between two ribs 641 and a lump portion 6410 is formed in the accommodating slot 6411. The lump portion 6410 divides the accommodating slot into a first accommodating slot 6411 and a second accommodating slot 6412 communicating with the first accommodating slot 6411. The first accommodating slot 6411 is located in the leftt side of the lump portion 6410 and the second accommodating slot 6412 is located upon the lump portion 6410. An edge of the memory module is received in the accommodating slot and retained in the vertical and transverse direction by first and second accommodating slots 6411, 6412.

It is to be understood, however, that even though numerous characteristics and advantages of the present invention have been set forth in the foregoing description, together with details of the structure and function of the invention, the disclosure is illustrative only, and changes may be made in detail, especially in matters of shape, size, and arrangement of parts within the principles of the invention to the full extent indicated by the broad general meaning of the terms in which the appended claims are expressed.

What is claimed is:

1. A card edge connector comprising:
   an elongated insulative housing extending along a left-to-right direction and having a pair of opposite two side walls, a central slot formed between two side walls, two end walls located in two opposited sides of the central slot and an attaching portion extending out from the end wall;
   a plurality of contacts retained in the insulative housing; and
   an ejector assembled to the attaching portion and having a base and two gripping portions extending upwardly and outwardly from the base, the two gripping portions defining an accommodating slot therebetween and a lump portion located in the accommodating slot and connecting the two gripping portions, the lump portion used for locking with a memory module, a side edge portion of which is partially received in the accommodating slot, and the lump portion locking the memory module, the accommodating slot having a first accommodating slot and a second accommodating slot communicating with the first accommodating slot at a position upon the lump portion, the first and second accommodating slots passing through the ejector upwardly, and the lump portion protectively downwardly hidden within the accommodating slot.

2. The card edge connector as claimed in claim 1, wherein the gripping portion has a plating portion and two extending portions extending inwardly from the plating portion, the first accommodating slot is located between two extending portions.

3. The card edge connector as claimed in claim 2, wherein the lump portion is located in the second accommodating slot of the gripping portion and connects with the two plating portions, the lump portion is received in a notch of the memory module and resists the memory module downwardly.

4. The card edge connector as claimed in claim 1, wherein the second accommodating slot passes through the ejector outwardly and upwardly, the first accommodating slot passes through the ejector along inwardly and upwardly.

5. The card edge connector as claimed in claim 1, wherein the attaching portion includes two extending walls and an attaching space located between the two extending walls, the ejector has an ejector portion extending from the base into the attaching space.

6. The card edge connector as claimed in claim 5, wherein the extending wall has a first side wall with a pivot hole on an inner face thereof, the ejector has a pair of shafts protruding from two sides of the ejector portion and rotating in the pivot hole.

7. The card edge connector as claimed in claim 6, wherein the extending wall has two second side walls extending upwardly from the first side walls, respectively the ejector has two locking portions located two sides of the base and each having a connecting portion connecting with the base and a positioning wall extending inwardly from the connecting portion, a receiving space is formed between two positioning walls and the second side walls of the attaching portion received in the received space.

8. The card edge connector as claimed in claim 7, wherein the positioning wall has a protruding portion extending inwardly from a free end thereof, the second side wall has a vertical protrusion rib extending outwardly, the protruding portion latches with the protrusion rib.

9. The card edge connector as claimed in claim 7, wherein the second side wall extends upwardly from an inner part of the first side wall and a top face of the first side wall without the second side wall defines an attaching face, and the ejector abuts against the attaching face downwardly.

10. The card edge connector as claimed in claim 8, wherein the second side wall has a convex extending outwardly near the protrusion rib, when the protruding portion latches with the protrusion rib, the protruding portion is located between the convex and protrusion rib, a side of the convex aslant and facing the protruding portion is an inclined.

11. An ejector adapted for being equipped with a card edge connector to lock a memory module inserted into the card edge connector, comprising:
a base; and
two gripping portions extending upwardly from two sides of the base, the gripping portions defining an accommodating slot therebetween, the accommodating slot passing through the ejector along a left-to-right direction for receiving a bottom edge of a memory module and a lump portion located in the accommodating slot for locking with the memory module in the accommodating slot, the accommodating slot having a first accommodating slot and a second accommodating slot communicating with the first accommodating slot at a position upon the lump portion, the first and second accommodating slots passing through the ejector upwardly and the lump portion protectively downwardly hidden within the accommodating slot.

12. The card edge connector as claimed in claim 11, wherein the gripping portion has a pair of plating portions and two extending portions respectively extending inwardly from the plating portions, the first accommodating slot is located between two extending portions.

13. The card edge connector as claimed in claim 11, wherein the lump portion is located in the second accommodating slot of the gripping portion and connects with the two plating portions, the lump portion is received in a notch of the memory module and resists the memory module downwardly.

14. The card edge connector as claimed in claim 11, wherein the second accommodating slot passes through the ejector outwardly and upwardly, the first accommodating slot passes through the ejector along inwardly and upwardly.

15. A card edge connector for use with a memory module, comprising:
an elongated housing defining therein a card receiving slot extending along a longitudinal direction with a tower at a lengthwise end and exposed to an exterior in a vertical direction perpendicular to said longitudinal direction;
a plurality of terminals disposed in the housing by two sides of the card receiving slot with corresponding contacting sections extending into the card receiving slot in a transverse direction perpendicular to both said longitudinal direction and said vertical direction; and
an ejector pivotally disposed upon the tower and defining a base, an ejecting portion extending from the base toward the card receiving slot generally in said longitudinal direction and defining thereon an upward face for abutment against a bottom edge of the memory module, a pivotal shaft located upon the ejecting portion to retain the ejector within the tower, a gripping portion extending from the base and defining an accommodating slot dimensioned in compliance with a thickness of the memory module for receiving a side region of the memory module for restraining movement of the memory module relative to the housing in the transverse direction, and further defining a lump portion for receipt within a notch of the memory module for restraining movement of the memory module relative to the housing in both the lengthwise direction and the vertical direction.

16. The card edge connector as claimed in claim 15, wherein said accommodating slot extends above and beneath said lump portion.

17. The card edge connector as claimed in claim 15, wherein said gripping portion includes an upward handle portion, and said accommodating slot extends through said handle portion.

18. The card edge connector as claimed in claim 15, wherein the pivotal shaft is located at an inner position along said longitudinal direction while the lump portion is located at an outer position along said longitudinal direction so that the pivotal shaft is located under the bottom edge of the memory module when said memory module is received in the card receiving slot.

* * * * *